(12) United States Patent
Frougier et al.

(10) Patent No.: US 11,646,306 B2
(45) Date of Patent: May 9, 2023

(54) CO-INTEGRATION OF GATE-ALL-AROUND FET, FINFET AND PASSIVE DEVICES ON BULK SUBSTRATE

(71) Applicant: INTERNATIONAL BUSINESS MACHINES CORPORATION, Armonk, NY (US)

(72) Inventors: Julien Frougier, Albany, NY (US); Veeraraghavan S. Basker, Schenectady, NY (US); Andrew Gaul, Halfmoon, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 17/210,610

(22) Filed: Mar. 24, 2021

(65) Prior Publication Data
US 2022/0310590 A1 Sep. 29, 2022

(51) Int. Cl.
*H01L 27/06* (2006.01)
*H01L 27/02* (2006.01)
*H01L 29/06* (2006.01)
*H01L 29/423* (2006.01)
*H01L 29/786* (2006.01)
(Continued)

(52) U.S. Cl.
CPC ...... *H01L 27/0629* (2013.01); *H01L 21/0259* (2013.01); *H01L 21/823412* (2013.01); *H01L 21/823431* (2013.01); *H01L 21/823481* (2013.01); *H01L 27/0255* (2013.01); *H01L 29/0665* (2013.01); *H01L 29/42392* (2013.01); *H01L 29/66742* (2013.01);
(Continued)

(58) Field of Classification Search
CPC .......... H01L 27/0629; H01L 29/42392; H01L 29/785; H01L 27/088
See application file for complete search history.

(56) References Cited

U.S. PATENT DOCUMENTS 5,075,253 A 12/1991 Sliwa, Jr.
9,012,997 B2 4/2015 Yamashita
(Continued)

OTHER PUBLICATIONS

Chen, et al., "ESD Protection Diodes in Bulk Si Gate-All-Around Vertically Stacked Horizontal Nanowire Technology," IEEE Transactions on Device and Materials Reliability, Mar. 2019 [accessed on Feb. 25, 2020], pp. 112-119, vol. 19, Issue 1, IEEE, DOI: 10.1109/TDMR.2018.2886399, Retrieved from the Internet: URL: https://ieeexplore.ieee.org/document/8576641>.

(Continued)

*Primary Examiner* — Changhyun Yi
(74) *Attorney, Agent, or Firm* — Samuel A. Waldbaum

(57) ABSTRACT

An apparatus that includes a substrate divided into a plurality of different regions, where the substrate remains physically together. A first device located in a first region of the plurality of different regions, where the first device has a first height. A second device located in a second region of the plurality of different regions. The second device has a second height and the second device is a different device from the first device. A third device located in a third region of the plurality of different regions. The third device has a third height and the third device is a different device from the first device and the second device. The second height is smaller than the first height.

19 Claims, 8 Drawing Sheets

(51) Int. Cl.
  *H01L 29/66* (2006.01)
  *H01L 21/02* (2006.01)
  *H01L 21/8234* (2006.01)
  *H01L 29/78* (2006.01)

(52) U.S. Cl.
  CPC ...... *H01L 29/66795* (2013.01); *H01L 29/785* (2013.01); *H01L 29/78696* (2013.01)

(56) References Cited

U.S. PATENT DOCUMENTS

| | | | |
|---|---|---|---|
| 9,397,200 | B2 | 7/2016 | Qi |
| 9,614,057 | B2 | 4/2017 | Doris |
| 9,640,531 | B1 | 5/2017 | Or-Bach |
| 9,761,722 | B1 | 9/2017 | Jagannathan |
| 9,847,391 | B1 | 12/2017 | Zang |
| 10,032,867 | B1 | 7/2018 | Yeung |
| 10,062,601 | B2 | 8/2018 | Lin |
| 10,170,638 | B1 | 1/2019 | Reznicek |
| 10,297,586 | B2 | 5/2019 | Or-Bach |
| 10,332,803 | B1 | 6/2019 | Xie |
| 2014/0097502 | A1* | 4/2014 | Sun .................. H01L 29/78696 977/762 |
| 2017/0213821 | A1 | 7/2017 | Or-Bach |
| 2019/0019891 | A1 | 1/2019 | Glass |
| 2019/0057868 | A1 | 2/2019 | Englekirk |
| 2019/0172826 | A1 | 6/2019 | Or-Bach |

OTHER PUBLICATIONS

Zhang, et al., "Full Bottom Dielectric Isolation to Enable Stacked Nanosheet Transistor for Low Power and High Performance Applications," 2019 IEEE International Electron Devices Meeting (IEDM), Dec. 7-11, 2019 [accessed on Sep. 24, 2020], 4 pages, IEEE, San Francisco, CA, USA, DOI: 10.1109/IEDM19573.2019.8993490, Retrieved from the Internet: <URL: https://ieeexplore.ieee.org/document/8993490>.

* cited by examiner

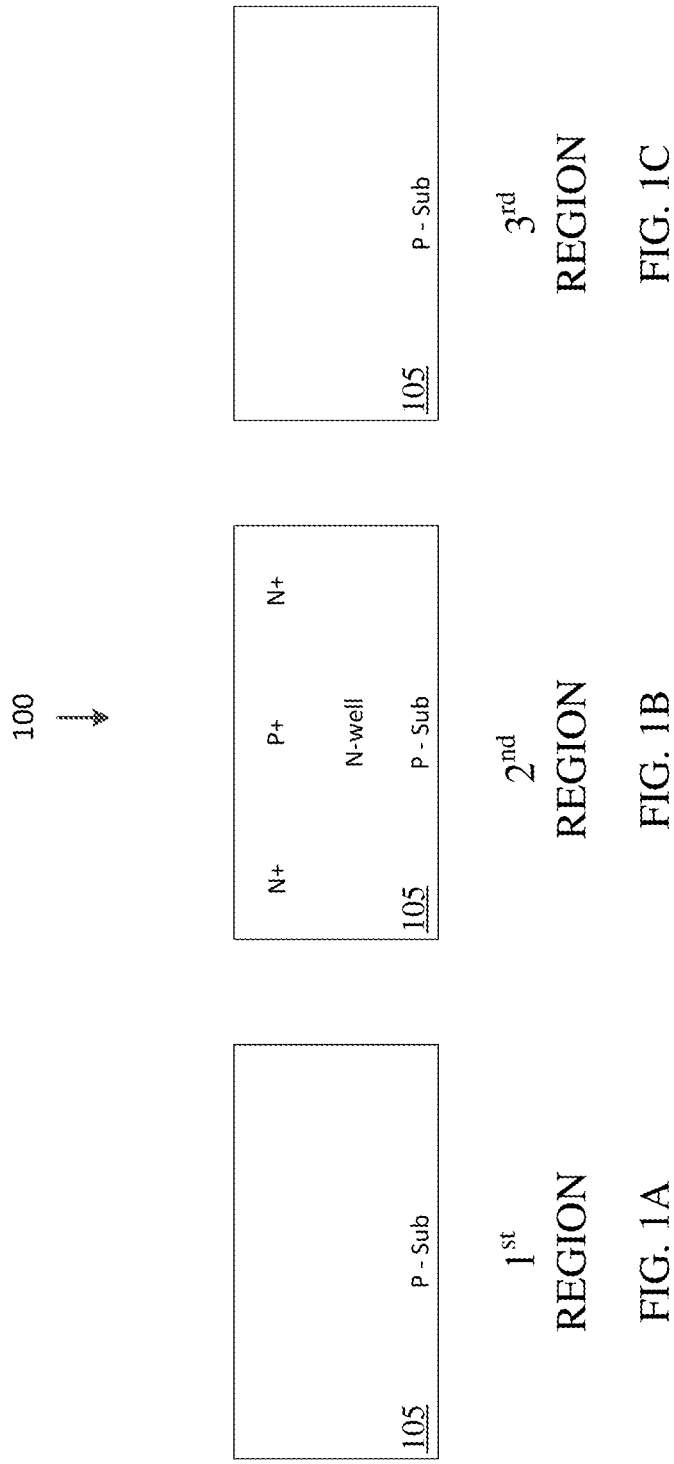

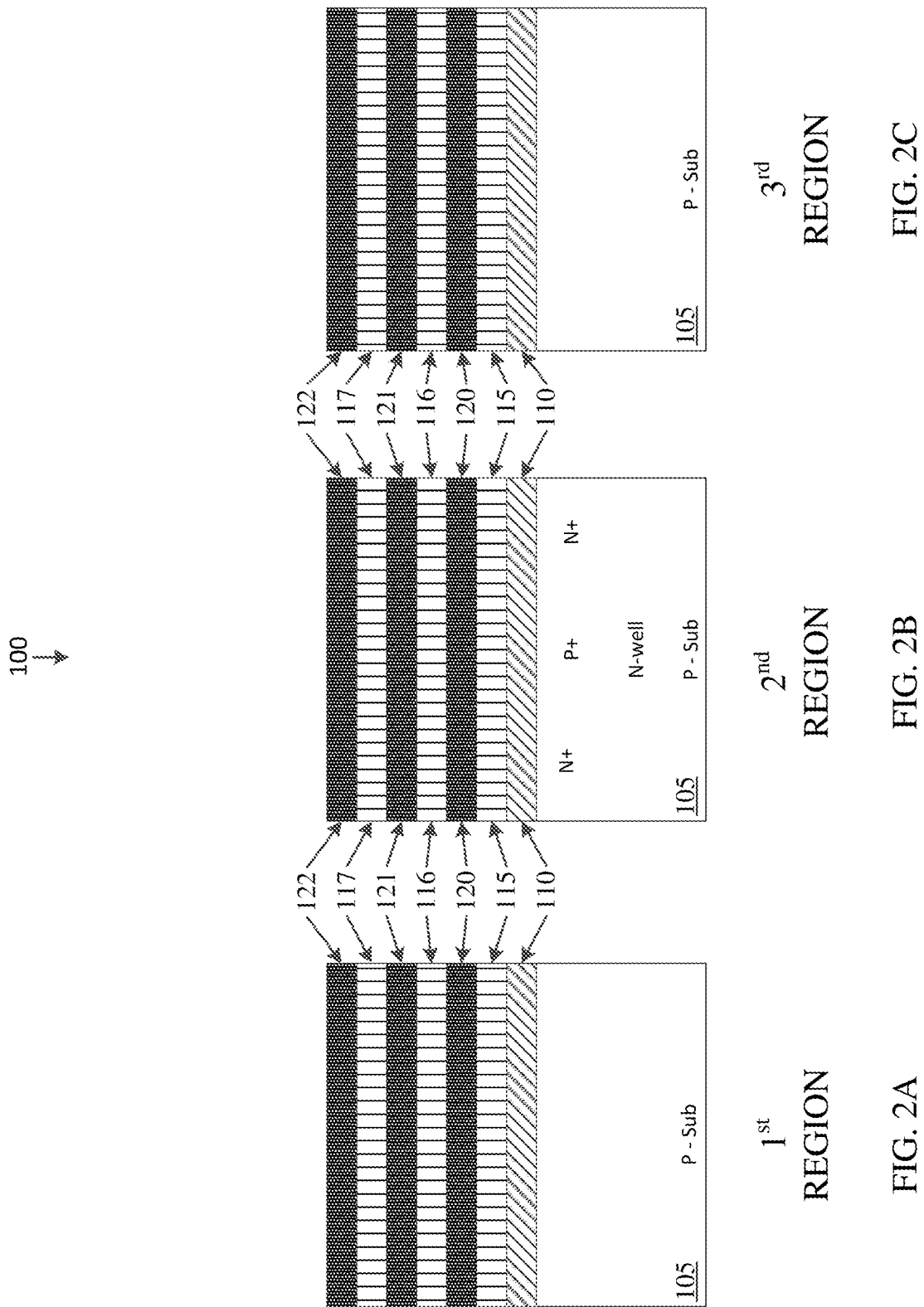

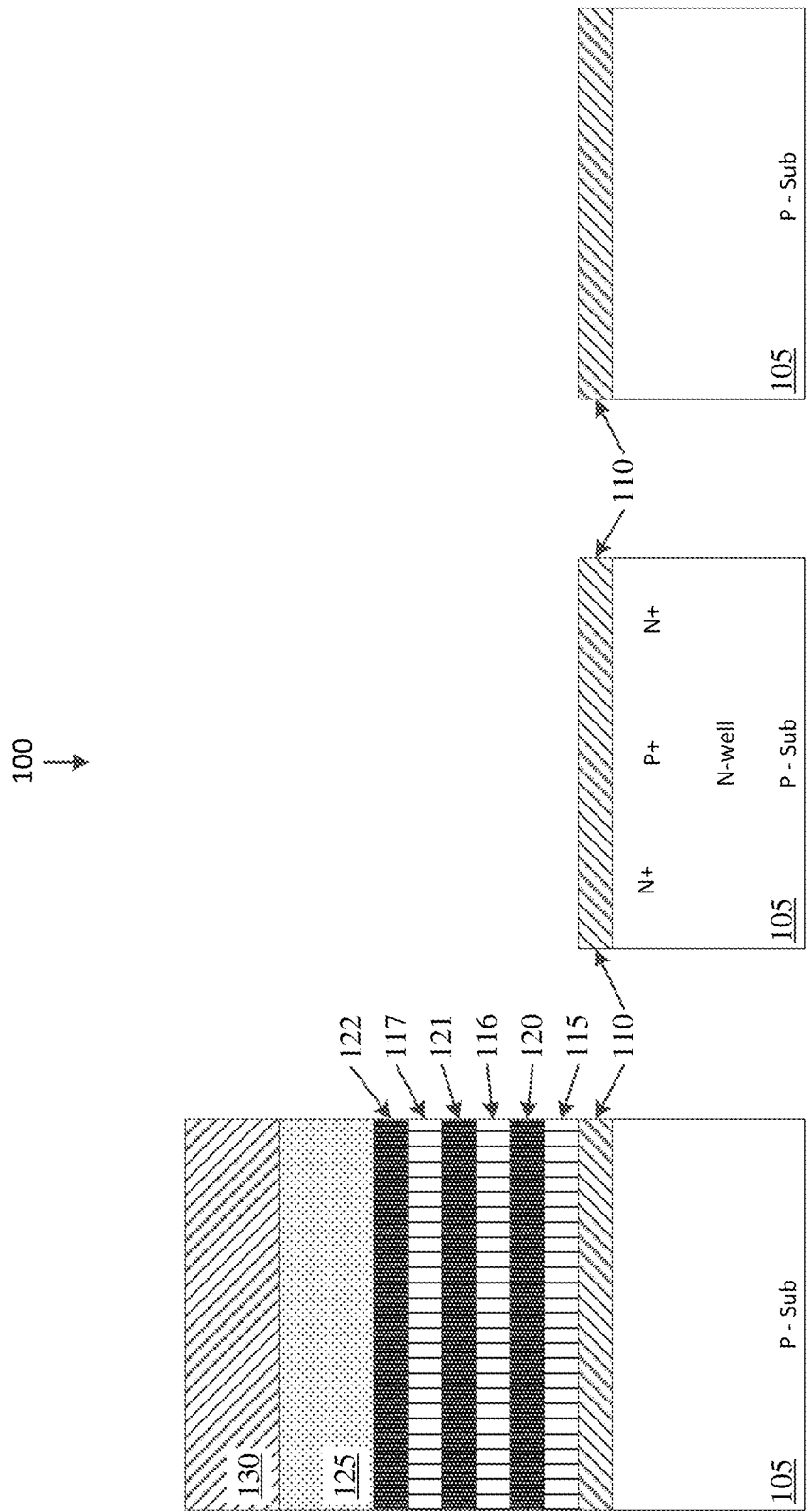

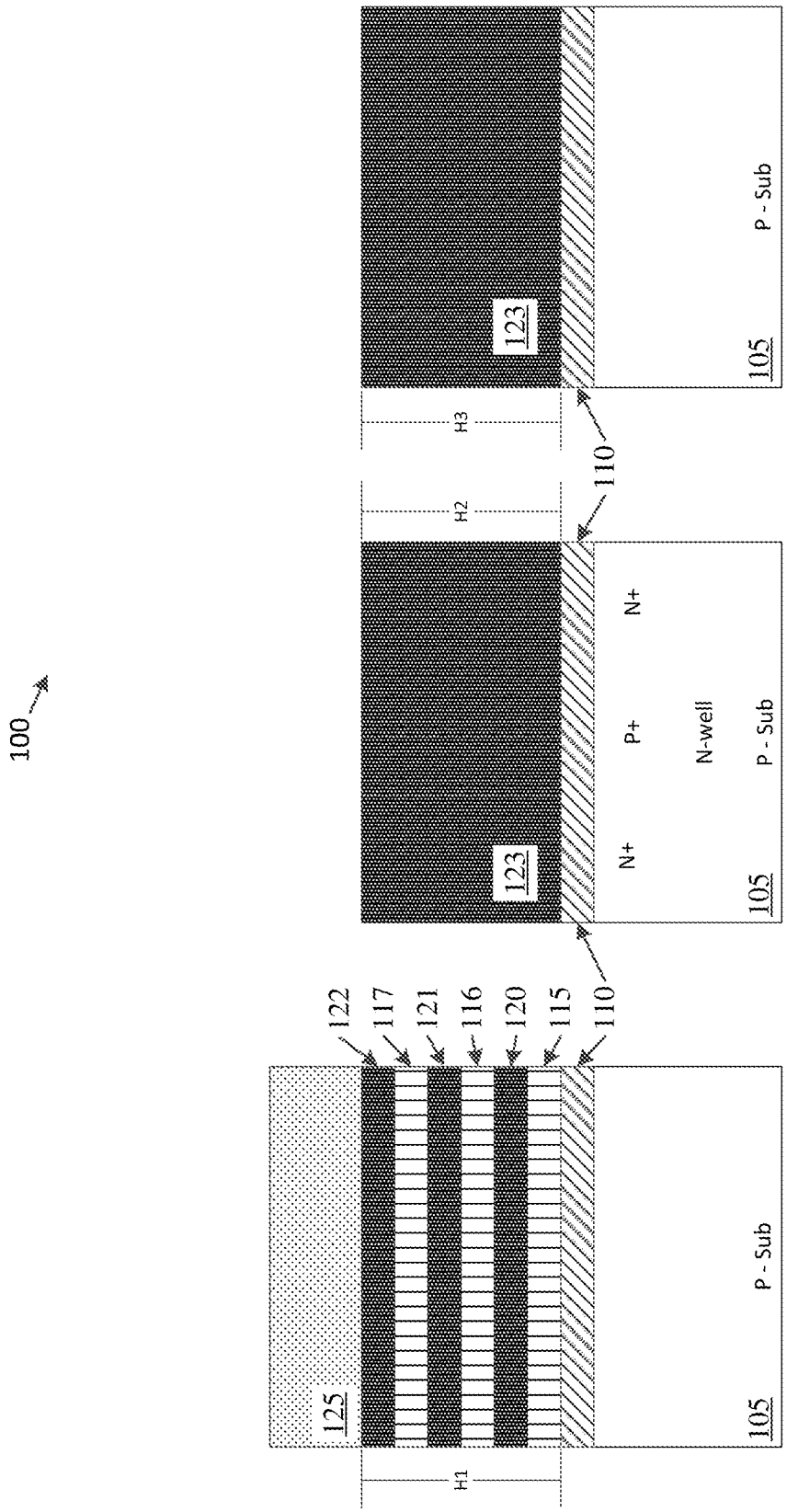

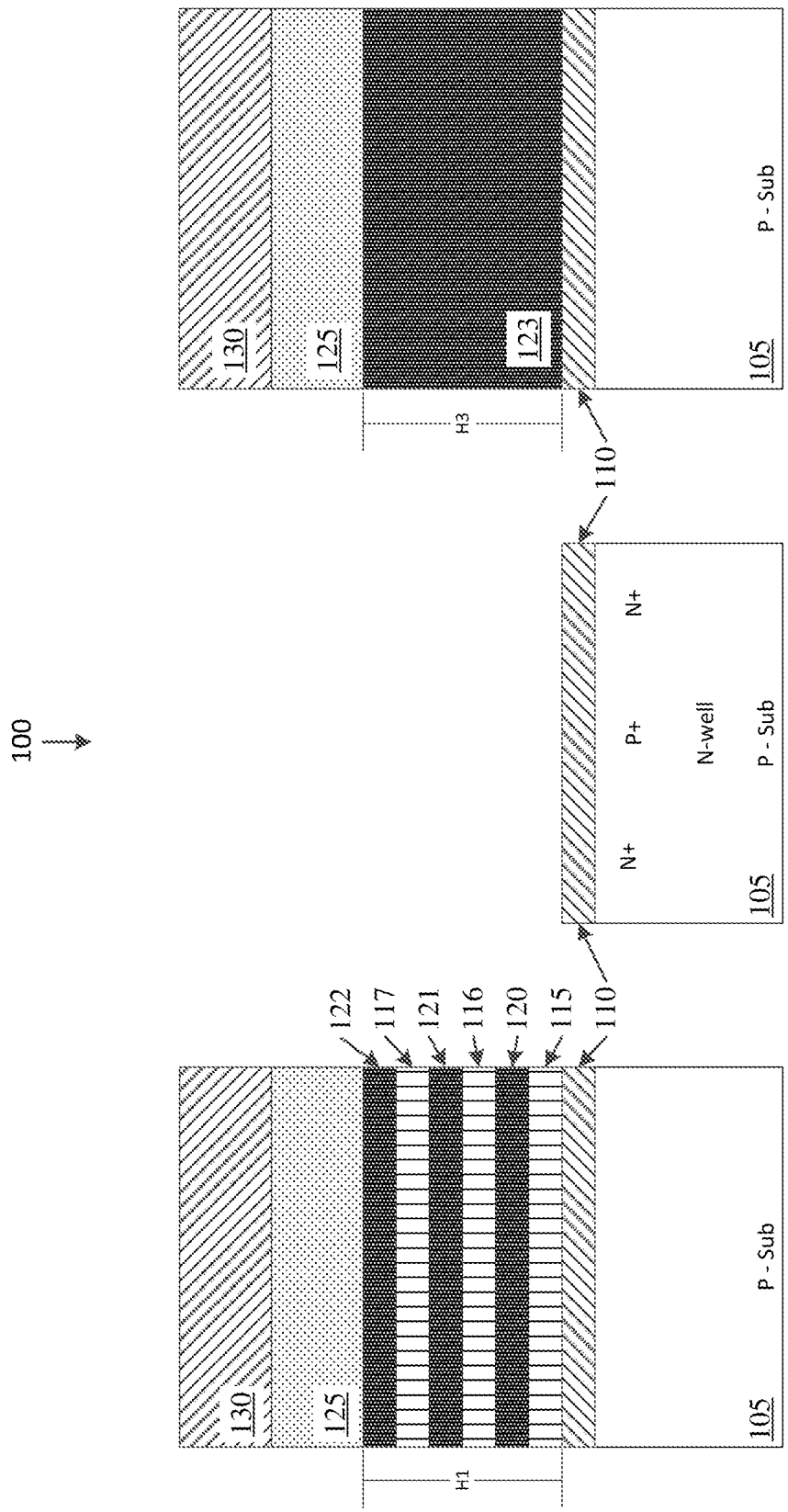

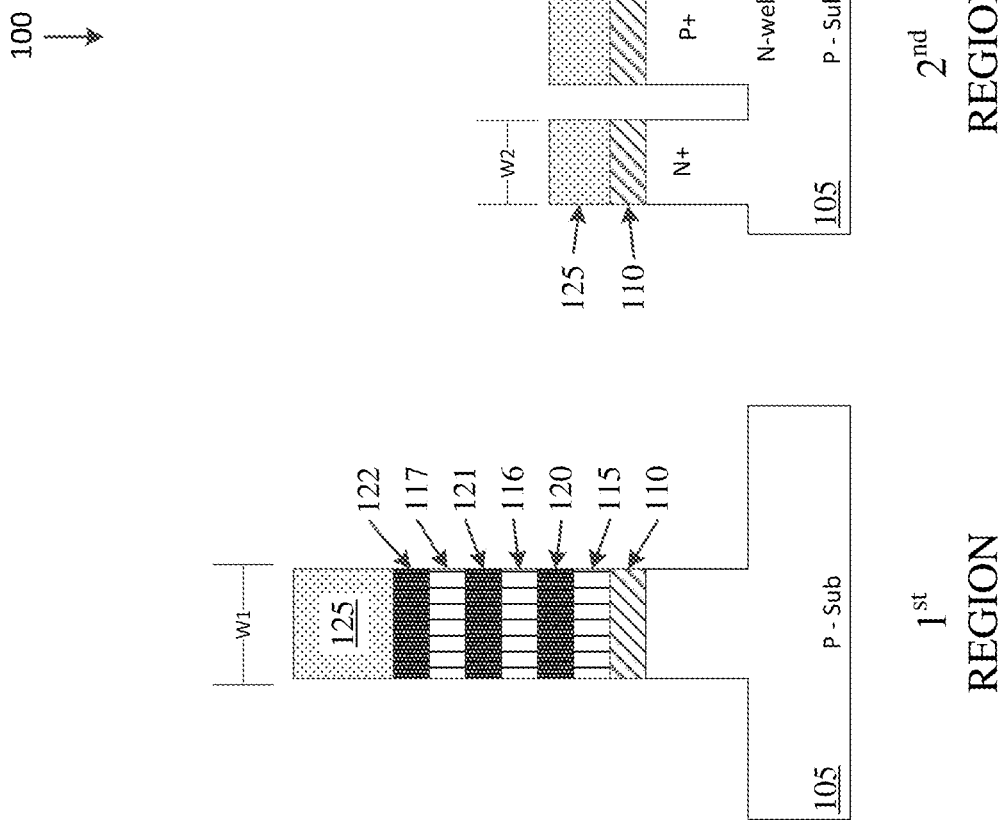

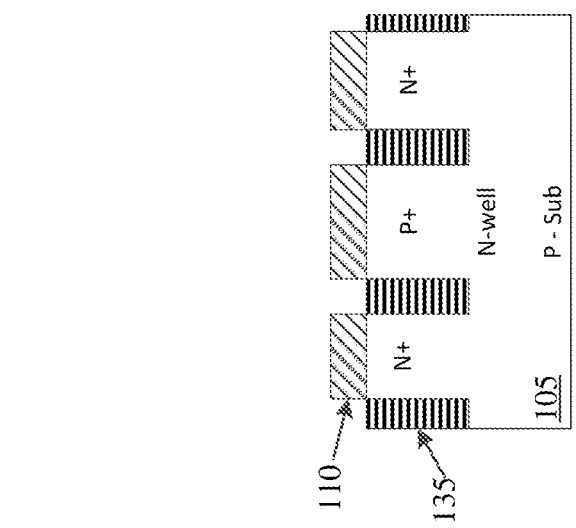
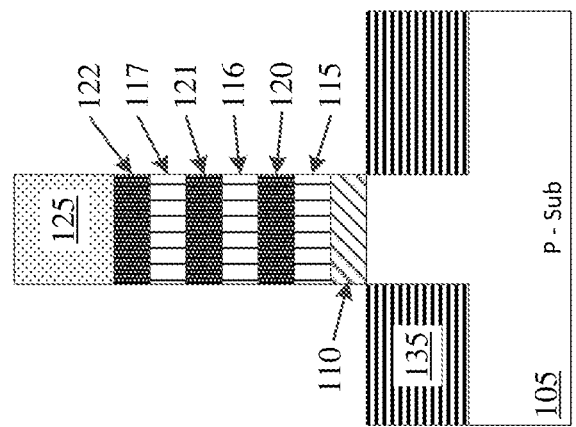
FIG. 7A  1st REGION
FIG. 7B  2nd REGION
FIG. 7C  3rd REGION

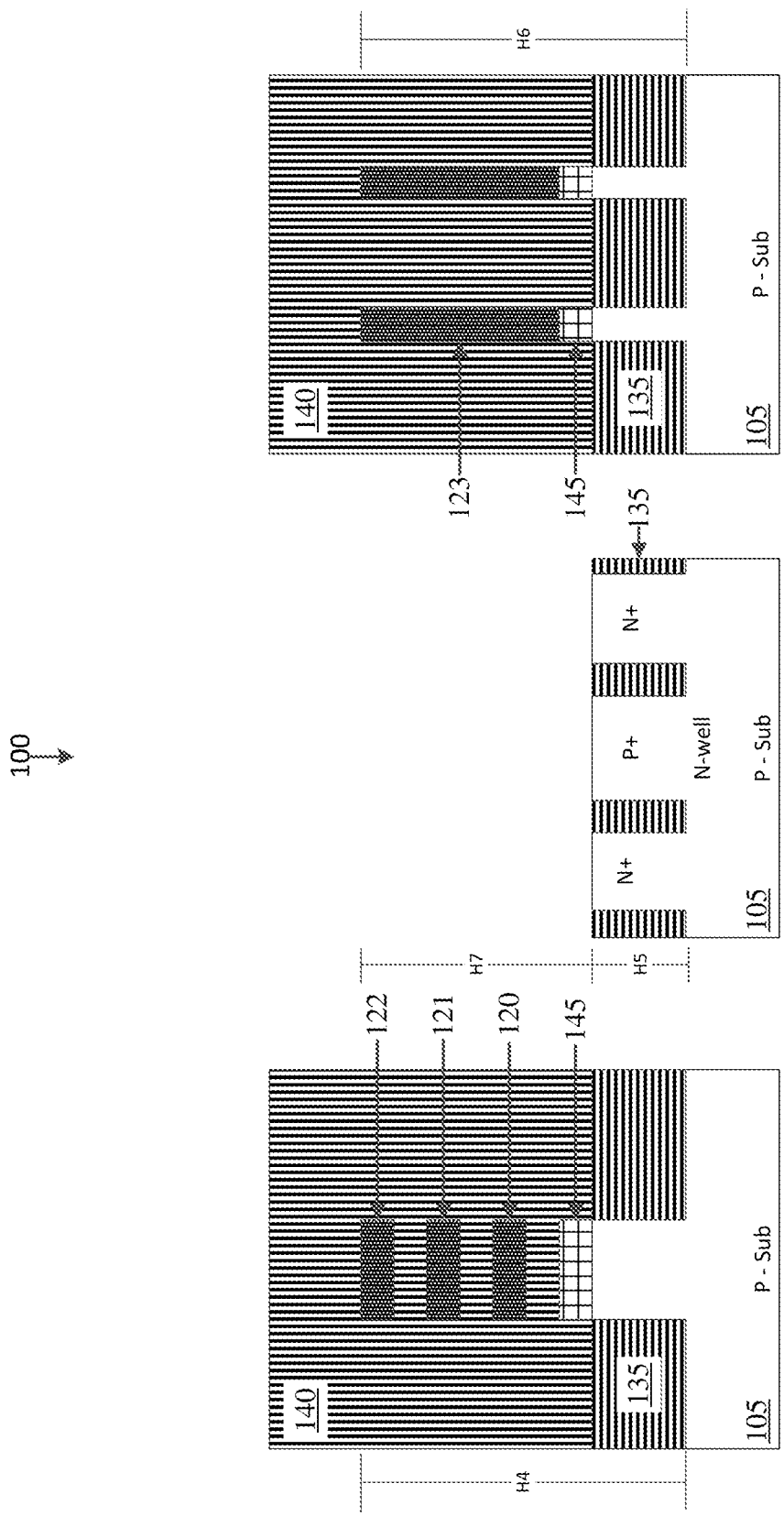

CO-INTEGRATION OF GATE-ALL-AROUND FET, FINFET AND PASSIVE DEVICES ON BULK SUBSTRATE

BACKGROUND

The present invention relates generally to the field of nanosheets, and more particularly to concurrently forming multiple different devices along with the nanosheet on the same substrate.

Gate-all-around device such as Nanosheet Field-Effect-Transistors (FETs) are becoming a technology of increasing importance with research and development focusing on standalone nanosheet devices.

BRIEF SUMMARY

Additional aspects and/or advantages will be set forth in part in the description which follows and, in part, will be apparent from the description, or may be learned by practice of the invention.

An apparatus comprising a substrate divided into a plurality of different regions, wherein the substrate remains physically together. A first device located in a first region of the plurality of different regions, wherein the first device has a first height. A second device located in a second region of the plurality of different regions, wherein the second device has a second height, wherein the second device is a different device from the first device. A third device located in a third region of the plurality of different regions, wherein the third device has a third height, wherein the third device is a different device from the first device and the second device. Wherein the second height is smaller than the first height.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIGS. 1A, 1B, and 1C illustrates a cross sections of different regions on the same substrate, in accordance with an embodiment of the present invention.

FIGS. 2A, 2B, and 2C illustrates a cross section of the different regions for the formation of a different device at each region, in accordance with an embodiment of the present invention.

FIGS. 3A, 3B, and 3C illustrates a cross section of the different regions for the formation of a different device at each region, in accordance with an embodiment of the present invention.

FIGS. 4A, 4B, and 4C illustrates a cross section of the different regions for the formation of a different device at each region, in accordance with an embodiment of the present invention.

FIGS. 5A, 5B, and 5C illustrates a cross section of the different regions for the formation of a different device at each region, in accordance with an embodiment of the present invention.

FIGS. 6A, 6B, and 6C illustrates a cross section of the different regions for the formation of a different device at each region, in accordance with an embodiment of the present invention.

FIGS. 7A, 7B, and 7C illustrates a cross section of the different regions for the formation of a different device at each region, in accordance with an embodiment of the present invention.

FIGS. 8A, 8B and 8C illustrates a cross section of the different devices formed at separate regions on the same substrate, in accordance with an embodiment of the present invention.

DETAILED DESCRIPTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. This application is directed to a method of concurrently forming multiple devices on the same substrate and the structure of the different devices on the substrate. The devices will be formed at the same time on different regions on the substrate. For example, the different devices can be a bottom dielectric isolated (BDI) nanosheet, an electrostatic discharge device, and a fin device. The starting substrate can be, for example, a Si wafer, a quartz wafer, a Sapphire wafer, metal line, or another layer that is suitable for being the starting layer for the formation of the multiple devices. The substrate is separated into a plurality of separate regions for processing, but the substrate remains physically whole, i.e., the substrate is not physically cut. A device will be concurrently formed in each of the separate regions, where the formed devices can be the same device or different devices. The locations of each of the plurality of separate regions can be adjacent to each other on the substrate or the locations of each of the plurality of separate regions can be spaced apart from each other to allow for the formation of other devices or lines on the substrate. The height of one of the finished devices can be different from the height of another of the finished devices, or the height of one of the finished devices can be substantially the same as the height of another of the finished devices, or a combination thereof.

FIGS. 1A, 1B, and 1C illustrates a cross sections 100 of different regions on the same substrate 105, in accordance with an embodiment of the present invention. The substrate 105 can be, for example, a Si wafer, a Sapphire wafer, metal layer, a non-metal layer, or any type of material that the multiple devices can be formed on. The substrate 105 is divided up into a plurality of separate regions for processing, e.g., each separate region will have a device formed thereon. The substrate 105 remains physically one-piece during processing, i.e., the substrate 105 is not physically separated into multiple substrates 105. FIG. 1A illustrates a first region on substrate 105, FIG. 1B illustrate a second region on substrate 105, and FIG. 1C illustrates a third region on substrate 105. The plurality of separate regions can be adjacent to another region of the plurality of separate regions, or the plurality of separate regions can be spaced apart from the other plurality of separate regions. For example, the $1^{st}$ region can be adjacent to the $2^{nd}$ region, but spaced apart from the $3^{rd}$ region, or the $1^{st}$ region can be adjacent to both the $2^{nd}$ and $3^{rd}$ regions, or the $1^{st}$ region can be adjacent to the $3^{rd}$ region, but spaced apart from the $2^{nd}$ region, or the $1^{st}$ region can be spaced apart from the $2^{nd}$ and $3^{rd}$ regions, while the $2^{nd}$ and $3^{rd}$ regions are adjacent to each other, or the $1^{st}$ region, the $2^{nd}$ region, and the $3^{rd}$ region can be spaced apart from each other, or any combination thereof. FIG. 1B illustrates the substrate 105 was doped with different materials to change the properties of the substrate 105 in the $2^{nd}$ region. For example, $2^{nd}$ region is doped to have a P-sub, N-well, N+, and P+ regions for a formation of an electrostatic discharge device. FIG. 1B illustrates that the substrate 105 can undergo processing prior to the formation of any layers on top of the substrate 105.

FIGS. 2A, 2B, and 2C illustrates a cross section of the different regions for the formation of a different device at each region, in accordance with an embodiment of the present invention. FIGS. 2A, 2B, and 2C show the $1^{st}$ region, $2^{nd}$ region, and the $3^{rd}$ region of the substrate 105. A plurality of layers is formed on the surface of the substrate 105. The first layer 110 is formed directly on the substrate 105. The first layer 110 can be formed by, for example, by epitaxially growing the first layer 110 on the substrate 105. The first layer 110 can serve a different purpose in different regions. For example, the first layer 110 can be used as a placeholder material in one region and the first layer 110 can be a sacrificial protective layer in another region. The first layer 110 can be comprised of SiGe with the germanium content ranging from 50% to 70%. The percentage amount of Ge in layer 110 is not a set factor, there just needs to be a difference in the percentage amount between the first layer 110 and the second layer 115 (also the fourth layer 116 and the sixth layer 117). The second layer 115 is formed directly on the first layer 110. The second layer 115 can by epitaxially growing the second layer 115 on the first layer 110. The second layer 115 can be comprised of SiGe with the germanium content ranging from 15% to 35%. The difference in the percentages between the first layer 110 and the second layer 115 (also the fourth layer 116 and the sixth layer 117) affects the downstream processing steps that can be applied to the different regions. The difference in the percentages of Ge in the first layer 110 and the second layer 115 (also the fourth layer 116 and the sixth layer 117) needs to be large enough to differentiate between the layers during downstream processing steps. A third layer 120 is formed directly on top of the second layer 115. The third layer 120 can be for example, Si, and the third layer 120 can be formed by epitaxially growing the third layer 120 on the second layer 115. A fourth layer 116 is formed directly on top of the third layer 120. The fourth layer 116 is comprised of the same material as the second layer 115. A fifth layer 121 is formed directly on the fourth layer 116. The fifth layer 121 is comprised of the same material as the third layer 120. A sixth layer 117 is formed directly on top of the fifth layer 121. The sixth layer 117 is comprised of the same material as the second layer 115. A seventh layer 122 is formed directly on top of the sixth layer 117. The seventh layer 122 is comprised of the same material as the third layer 120. FIGS. 2A, 2B, and 2C illustrate only three stacks of SiGe (second layer 115, fourth layer 116, and sixth layer 117) and three stacks of Si (third layer 120, fifth layer 121, and seventh layer 122) is meant for illustrative proposes only, the number of stacks can be greater or fewer than the three stacks shown. The stack of layers as illustrate FIG. 2A can be known as a Gate-All-Around (GAA) Epitaxial stack (second layer 115, the third layer 120, the fourth layer 116, the fifth layer 121, the sixth layer 117, and the seventh layer 122). At this point in the process the $1^{st}$ region, $2^{nd}$ region, and the $3^{rd}$ region are treated the same way, as illustrated by FIGS. 2A, 2B, and 2C.

FIGS. 3A, 3B, and 3C illustrates a cross section of the different regions for the formation of a different device at each region, in accordance with an embodiment of the present invention. A hard mask 125 is formed directly on top of the seventh layer 122 in each of the regions. A patterning layer 130 is formed directly on top of the hard mask layer 125 in each of the regions. The patterning layer 130 can be, for example, an organic planarization layer. The patterning layer 130 allows for the patterning of each of the regions, where each of the regions can be independently patterned from each other. Thus, during an etching process each region can be treated independently from the other regions. FIG. 3A illustrates the formation of the first device in the $1^{st}$ region, for example, the end device can be a bottom dielectric isolation nanosheet. The patterning of the overall device allows for the multiple layers in the $1^{st}$ region not to be etched. As illustrated by FIGS. 3B and 3C, the $2^{nd}$ and $3^{rd}$ region are etched to remove the multiple layers down to the first layer 110. The first layer 110 in the $2^{nd}$ and $3^{rd}$ regions prevents damage to the substrate 105 by the etching process, since the etching process is stop prior to the reaching the underlying substrate 105.

FIGS. 4A, 4B, and 4C illustrates a cross section of the different regions for the formation of a different device at each region, in accordance with an embodiment of the present invention. The patterning layer 130 is removed from the top of the $1^{st}$ region in FIG. 4A. A layer 123 is formed on top of the first layer 110 in the $2^{nd}$ and $3^{rd}$ regions, as illustrated by FIGS. 4B and 4C. Layer 123 can be for example, Si, and layer 123 can be formed by epitaxially growing layer 123 on the first layer 110 in the $2^{nd}$ and $3^{rd}$ regions. The height H2 of layer 123 in the $2^{nd}$ region, as illustrated by FIG. 4B, is substantially equal to the height H1 in the $1^{st}$ region of the combined height of the second layer 115, the third layer 120, the fourth layer 116, the fifth layer 121, the sixth layer 117, and the seventh layer 122. The height H3 of the layer 123 in the $3^{rd}$ region, as illustrated by FIG. 4C, is substantially equal to the height H1 in the $1^{st}$ region of the combined height of the GAA Epitaxial stack. The height H2 of the layer 123 in the $2^{nd}$ region is substantially the same as the height H3 of the layer 123 in the $3^{rd}$ region.

FIGS. 5A, 5B, and 5C illustrates a cross section of the different regions for the formation of a different device at each region, in accordance with an embodiment of the present invention. A hard mask 125 is formed directly on top of the layer 123 on the $2^{nd}$ region and $3^{rd}$ region. The additional hard mask 125 material adds to the thickness of the hard mask 125 formed on top of the seventh layer 122 in the $1^{st}$ region. A patterning layer 130 is formed directly on top of the hard mask layer 125 in each of the regions. The patterning layer 130 can be, for example, an organic planarization layer. The patterning layer 130 allows for the patterning of each of the regions, where each of the regions can be independently patterned from each other. Thus, during an etching process each region can be treated independently from the other regions. The layer 123 is removed in the $2^{nd}$ region, as illustrated by FIG. 5B, where the first layer 110 acts as an etch stop. The first layer 110 in the $2^{nd}$ region protects the underlying substrate 105 from being damaged by the etching process. FIG. 5A illustrates that the $1^{st}$ region remains untouched by the etching process, and FIG. 5C illustrates that the $3^{rd}$ region remains untouched by the etching process. FIGS. 5A, 5B, and 5C illustrate that each region can be independently processed so that different devices can be formed in the different regions.

FIGS. 6A, 6B, and 6C illustrates a cross section of the different regions for the formation of a different device at each region, in accordance with an embodiment of the present invention. FIGS. 6A, 6B and 6C illustrate each of the regions being etched to form the devices. A hard mask 124 is formed on the top surface of each region and a pattern layer (not shown) is formed on the hard mask 125. Each region is patterned prior to the anisotropic etching process to determine the shape of the devices after the etching process. The final device determines how, and which region are to be etched. The etching process removes some of the substrate 105 in each of the regions. FIG. 6A illustrates the formation of a nanosheet device, where the width W1 of the nanosheet device can be controlled by the patterning of the hard mask 125 prior to the etching process. FIG. 6B illustrate the formation of a passive device such as an electrostatic discharge (ESD) device, where width W2 of the ESD device is controlled by the patterning of the hard mask 125 prior to the etching process. FIG. 6C illustrates the formation of fins, where the width W3 of the fins is controlled by the patterning of the hard mask 125 prior to the etching process.

FIGS. 7A, 7B, and 7C illustrates a cross section of the different regions for the formation of a different device at each region, in accordance with an embodiment of the present invention. A trench filler layer 135 is formed in the gaps formed in the substrate 105. The trench filler layer 135 can be, for example, a shallow trench isolation material such as an oxide. As illustrated in FIG. 7A, the trench filler layer 135 fills the gaps on substrate 105 on both sides of the pillar, where the height of the trench filler layer 135 reaches to about the bottom of the first layer 110. As illustrated in FIG. 7B, the trench filler layer 135 fills the gaps on substrate 105 around the columns created in the substrate 105, where the height of the trench filler layer 135 reaches to about the bottom of the first layer 110. As illustrated in FIG. 7C, the trench filler layer 135 fills the gaps on substrate 105 on both sides of the fins and between the fins, where the height of the trench filler layer 135 reaches to about the bottom of the first layer 110.

FIGS. 8A, 8B and 8C illustrates a cross section of the different devices formed at separate regions on the same substrate 105, in accordance with an embodiment of the present invention. FIGS. 8A, 8B, and 8C illustrate the completed devices after further processing steps. FIG. 8A illustrates the replacement of the first layer 110 with a bottom dielectric isolation (BDI) layer 145. The BDI layer 145 is formed by selectively removing the sacrificial first layer 110 SiGe (Ge=50-70%) and replacing it with the BDI material. The BDI layer 145 can be comprised of, for example, oxide, a low-k dielectric such as SiBCN, SiOCN, SiOC, or a combination thereof. The first layer 110 can be selectively replaced over the second layer 115 because of the difference of the percentage of Ge in the layers. The second layer 115, the fourth layer 116, and the sixth layer 117 are replaced with a multi-layer gate stack 140. The multi-layer gate stack 140 comprises an insulative gate dielectric and at least one conductive layer over the gate dielectric material and encloses each of the third layer 120, the fifth layer 121, and the seventh layer 122. The multi-layer gate stack 140 is comprised of a high-k metal gate material.

The overall height H4 of the nanosheet device, is the height from the bottom of the trench filler layer 135 to the top of the device (e.g., the top of seventh layer 122). As illustrated by FIG. 8B the top surface of the substrate 105 is exposed by the removal of the first layer 110. The top surface of the substrate 105 should be undamaged from all the prior processing steps since the first layer 110 acted as a sacrificial protection layer. The first layer 110 and any of the gate metal 140 that was formed in the $2^{nd}$ region has been removed to expose the top of the substrate 105. The height H5 of the electrostatic discharge device in the $2^{nd}$ region is less than the height H4 of the nanosheet device in the $1^{st}$ region. The difference in the height H4 and the height H5 is the height H7 to the top of the nanosheet device (e.g., the top of the seventh layer 122).

FIG. 8C illustrates that the first layer 110 in each of the fins was replaced by the BDI layer 145 and that the multi-layer gate stack 140 has enclosed the fins. The fin device illustrated by FIG. 8C, can exhibit bottom dielectric isolation of at least the gate region or both the gate and Source-Drain regions. The height H6 of the fins should have a height that is substantially the same as the height H4 as the nanosheet device in the $1^{st}$ region.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An apparatus comprising:
    a substrate divided into a plurality of different regions, wherein the substrate remains physically together;
    a first device located in a first region of the plurality of different regions, wherein the first device has a first height;
    a second device located in a second region of the plurality of different regions, wherein the second device has a second height, wherein the second device is a different type of device from the first device, wherein the second device is a passive device such as an electrostatic discharge diode (ESD) device;
    a third device located in a third region of the plurality of different regions, wherein the third device has a third height, wherein the third device is a different type of device from the first device and the second device; and
    wherein the second height is smaller than the first height.

2. The apparatus of claim 1, wherein the first device is a Gate-All-Around device with bottom dielectric isolation of at least the gate region or both the gate and Source-Drain regions.

3. The apparatus of claim 2, further comprising:
a multi-layer gate stack that encloses at least one gate-all-around channel or at least two vertically stacked gate-all-around channels.

4. The apparatus of claim 3, wherein the multi-layer gate stack comprises an insulative gate dielectric and at least one conductive layer over the insulative gate dielectric.

5. The apparatus of claim 3, wherein the multi-layer gate stack is in contact with at least one surface of a bottom dielectric isolation layer, and wherein the substrate is in contact with at least one surface of a bottom dielectric isolation layer.

6. The apparatus of claim 5, further comprising:
a shallow trench isolation layer is located on the substrate beneath the multi-layer gate stack and adjacent to the substrate that is located bellow the bottom dielectric layer.

7. The apparatus of claim 1, wherein a top surface of the passive device is substantially aligned with the top surface of the substrate in contact with a bottom surface of a bottom dielectric isolation layer of the first and third devices.

8. The apparatus of claim 1, wherein the third device is comprised of device that includes at least one fin device.

9. The apparatus of claim 8, wherein the at least one fin device can exhibit bottom dielectric isolation of at least a gate region or both the gate and a Source-Drain regions.

10. The apparatus of claim 9, further comprising:
a multi-layer gate stack that encloses the at least one fin device.

11. The apparatus of claim 1, wherein the first device is a gate-all-around device with bottom dielectric isolation, wherein the third device is a fin device, wherein the first device, the second device and the third device are integrated into a same substrate.

12. A method comprising:
dividing a substrate into a plurality of different regions for processing, wherein the substrate remains physically together;
forming a first layer on top of the substrate in each of the plurality of regions, wherein the first layer acts as a replacement layer in a first region of the plurality of regions, wherein the first layer acts as a sacrificial protection layer in a second region of the plurality of regions, and wherein the first layer acts as a replacement layer in a third region of the plurality of regions;
forming a plurality of layers on top of the first layer;
processing the first region, the second region, and the third region of the plurality of regions concurrently to produces a first device in the first region, a second device in the second region, and a third device in the third region, wherein the first device, the second device, and the third device are different devices.

13. The method of claim 12, wherein the first layer in the first region is replaced with a bottom dielectric isolation layer.

14. The method of claim 13, wherein the bottom dielectric isolation layer is selected from a group consisting of an oxide, nitride, low-k dielectric such as SiBCN, SiOCN, SiOC, or a combination thereof.

15. The method of claim 12, wherein the first device has a first height, wherein the second device has a second height, wherein the third device has a third height, wherein the second height is different from the first height and the third height.

16. The method of claim 15, wherein the second height is less than the first height, and wherein the second height is less than the third height.

17. The method of claim 12, wherein the first device is a gate-all-around device with bottom dielectric isolation, wherein the second device is a passive device such as an electrostatic discharge diode, wherein the third device is comprised of a device that includes at least one fin, wherein the first device, the second device and the third device are integrated into a same substrate.

18. The method of claim 12, further comprising;
removing the first layer in the in the second region in at end of processing to expose a top surface of the substrate, wherein the first layer protected the top surface of the substrate from being damaged during the processing of the first device, the second device, and the third device.

19. The method of claim 12, wherein the first layer in third region is replaced with a bottom dielectric isolation layer.

* * * * *